(12) United States Patent
Nakano et al.

(10) Patent No.: US 7,000,215 B2
(45) Date of Patent: Feb. 14, 2006

(54) METHOD OF AND COMPUTER PROGRAM PRODUCT FOR DESIGNING PATTERNS, AND METHOD OF MANUFACTURING SEMICONDUCTOR DEVICE

(75) Inventors: Ayako Nakano, Yokohama (JP); Koji Hashimoto, Yokohama (JP); Takashi Sato, Fujisawa (JP); Tsuyoshi Shibata, Yokohama (JP); Yuji Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 10/642,266

(22) Filed: Aug. 18, 2003

(65) Prior Publication Data

US 2004/0088675 A1 May 6, 2004

(30) Foreign Application Priority Data

Aug. 19, 2002 (JP) ............................ P2002-238357

(51) Int. Cl.
*G06F 17/50* (2006.01)
(52) U.S. Cl. .......................................... 716/19; 716/21
(58) Field of Classification Search .................... 716/2, 716/5, 8–11, 19–21; 430/5, 311, 313; 438/57–60, 438/514
See application file for complete search history.

(56) References Cited

U.S. PATENT DOCUMENTS

| | | | | |
|---|---|---|---|---|
| 3,998,639 A | * | 12/1976 | Feldman et al. | 430/30 |
| 6,268,234 B1 | * | 7/2001 | Yoshida | 438/60 |
| 6,509,251 B1 | * | 1/2003 | Saito et al. | 438/514 |
| 6,536,015 B1 | * | 3/2003 | Ono | 716/2 |
| 6,664,010 B1 | * | 12/2003 | Ahrens et al. | 430/5 |
| 6,721,938 B1 | * | 4/2004 | Pierrat et al. | 716/19 |
| 6,815,148 B1 | * | 11/2004 | Matsumoto | 430/313 |
| 2003/0126582 A1 | * | 7/2003 | Kobayashi et al. | 716/21 |
| 2003/0163791 A1 | * | 8/2003 | Falbo et al. | 716/2 |

FOREIGN PATENT DOCUMENTS

JP 2001-133956 5/2001

* cited by examiner

*Primary Examiner*—Vuthe Siek
(74) *Attorney, Agent, or Firm*—Finnegan, Henderson, Farabow, Garrett & Dunner, L.L.P.

(57) ABSTRACT

A method of designing patterns has preparing a mask pattern used in a lithography process for transferring a circuit pattern intersecting with a step pattern on a substrate which has the step pattern designed thereon, and applying correction patterns to the mask pattern in accordance with correction rules considering a shape of the step pattern, the correction patterns being applied at intersections of edges of the circuit pattern and the step pattern and in the vicinity of the intersections.

18 Claims, 12 Drawing Sheets

FIG. 6

| HEIGHT OF STEP PATTERN (nm) | WIDTH OF STEP PATTERN (nm) | | | | | | | | |
|---|---|---|---|---|---|---|---|---|---|
| | 0 | | 200 | | 400 | | 600 | | |
| | W | L | W | L | W | L | W | L | |
| 0 | 0 | 0 | 0 | 0 | 0 | 0 | 0 | 0 | |
| 100 | 0 | 0 | 25 | 225 | 25 | 425 | 25 | 625 | |
| 200 | 0 | 0 | 50 | 250 | 50 | 450 | 50 | 650 | |
| 300 | 0 | 0 | 50 | 275 | 50 | 475 | 50 | 675 | |
| 400 | 0 | 0 | 50 | 300 | 50 | 500 | 50 | 700 | |

W : WIDTH OF CORRECTION PATTERN, L : LENGTH OF CORRECTION PATTERN

METHOD OF AND COMPUTER PROGRAM PRODUCT FOR DESIGNING PATTERNS, AND METHOD OF MANUFACTURING SEMICONDUCTOR DEVICE

CROSS REFERENCE TO RELATED APPLICATIONS

This application is based upon and claims the benefit of priority from the prior Japanese Patent Application No. P2002-238357 filed on Aug. 19, 2002; the entire contents of which are incorporated herein by reference.

BACKGROUND OF THE INVENTION

1. Field of the Invention

The present invention relates to a method of and a computer program product for designing patterns, and a method of manufacturing a semiconductor device. Particularly, the present invention relates to a method of and a computer program product for designing a mask pattern used in designing a circuit pattern on a substrate to be processed, and a method of manufacturing a semiconductor device using the mask pattern.

2. Description of Related Art

In recent years, along with higher integration and speeding up of semiconductor devices, requirements imposed upon a dimension of a circuit pattern have become extremely strict. Consequently, differences between a designed dimension and a finished dimension due to resolution limit in a wafer manufacturing process and the like have become obvious. As means for correcting the differences between the designed dimension and the finished dimension, various kinds of optical proximity correction (OPC) have been proposed. The OPC is a technology of correcting changes in a pattern dimension caused in a wafer manufacturing process, by partially widening a mask pattern, by providing a dummy pattern and the like fully using optical simulations.

For example, FIG. 1A shows a mask pattern 51 for forming gate wiring, the shape of a pattern end thereof is below the resolution limit and thus a pattern end of a transferred circuit pattern 52 becomes short. This is called shortening. The thinner the line width of the gate wiring becomes, the more obviously the shortening appears.

Therefore, as shown in FIG. 1B, a correction pattern 53, which is obtained by uniformly extending the mask pattern 51 in its longitudinal direction, is applied to a pattern end of the mask pattern 51. Thus, the shortening can be suppressed. Moreover, as shown in FIG. 1C, the shortening can be also suppressed by applying a hammer head 54 to a side of a pattern end of the mask pattern 51.

However, in the OPC of the related art, there is no consideration given to evenness of a base on which patterns are designed. Therefore, when patterns are designed on an uneven base, the differences between the designed dimension and the finished dimension cannot be eliminated.

For example, considered is a case where a base includes the substrate 13 to be processed and a step pattern 14 formed on the substrate 13, as shown in FIGS. 2A and 2B. In a circuit pattern 55 transferred using such a mask pattern 29 as shown in FIG. 3, which intersects with the step pattern 14, footing occurs at the intersection of the circuit pattern 55 and the step pattern 14. Therefore, a desired pattern in accordance with the mask pattern 29 cannot be designed. Thus, the footing of the circuit pattern 55 at the intersection or at the intersection and in the vicinity thereof is difficult to be corrected by the above-described OPC technology of the related art.

SUMMARY OF THE INVENTION

A first aspect of the present invention provides a method of designing patterns having: preparing a mask pattern used in a lithography process for transferring a circuit pattern intersecting with a step pattern on a substrate which has the step pattern designed thereon; and applying correction patterns to the mask pattern in accordance with correction rules considering a shape of the step pattern, the correction patterns being applied at intersections of edges of the circuit pattern and the step pattern and in the vicinity of the intersections.

A second aspect of the present invention provides a method of designing patterns having: preparing a mask pattern used in a lithography process for transferring a circuit pattern intersecting with a step pattern on a substrate which has the step pattern designed thereon; measuring an amount of footing of edges of the circuit pattern, the footing occurring at one of intersections of the edges of the circuit pattern and the step pattern or the intersections and in the vicinity thereof in executing the lithography process by use of the mask pattern; preparing correction rules considering a shape of the step pattern; applying correction patterns to the mask pattern in accordance with the correction rules, the correction patterns being applied at the intersections and in the vicinity of the intersections; executing process simulations by use of the mask pattern to which the correction patterns are applied; evaluating operation characteristics of circuit devices, which are obtained by the process simulations; and reviewing the correction rules until desired operation characteristics are obtained and repeatedly executing the application of the correction patterns and the process simulations.

A third aspect of the present invention provides a computer program product for designing patterns having: instructions configured to prepare a mask pattern used in a lithography process for transferring a circuit pattern intersecting with a step pattern on a substrate which has the step pattern designed thereon; and instructions configured to apply correction patterns to the mask pattern in accordance with correction rules considering a shape of the step pattern, the correction patterns being applied at intersections of edges of the circuit pattern and the step pattern and in the vicinity of the intersections.

A fourth aspect of the present invention provides a computer program product for designing patterns having: instructions configured to prepare a mask pattern used in a lithography process for transferring a circuit pattern intersecting with a step pattern on a substrate which has the step pattern designed thereon; instructions configured to measure an amount of footing of edges of the circuit pattern, the footing occurring at one of intersections of the edges of the circuit pattern and the step pattern or the intersections and in the vicinity thereof in executing the lithography process by use of the mask pattern; instructions configured to prepare correction rules considering a shape of the step pattern; instructions configured to apply correction patterns to the mask pattern in accordance with the correction rules, the correction patterns being applied at the intersections and in the vicinity of the intersections; instructions configured to execute process simulations by use of the mask pattern to which the correction patterns are applied; instructions configured to evaluate operation characteristics of circuit devices, which are obtained by the process simulations; and instructions configured to review the correction rules until desired operation characteristics are obtained and repeatedly executing the application of the correction patterns and the process simulations.

A fifth aspect of the present invention provides a method of manufacturing a semiconductor device having: preparing a mask pattern used in a lithography process for designing a circuit pattern intersecting with a step pattern on a substrate which has the step pattern designed thereon; applying correction patterns to the mask pattern in accordance with correction rules considering a shape of the step pattern, the correction patterns being applied at intersections of edges of the circuit pattern and the step pattern and in the vicinity of the intersections; and forming the circuit pattern on the substrate, by use of the mask pattern to which the correction patterns are applied.

A sixth aspect of the present invention provides a method of manufacturing a semiconductor device having: preparing a mask pattern used in a lithography process for transferring a circuit pattern intersecting with a step pattern on a substrate which has the step pattern designed thereon; measuring an amount of footing of edges of the circuit pattern, the footing occurring at one of intersections of the edges of the circuit pattern and the step pattern or the intersections and in the vicinity thereof in executing the lithography process by use of the mask pattern; preparing correction rules considering a shape of the step pattern; applying correction patterns to the mask pattern in accordance with the correction rules, the correction patterns being applied at the intersections and in the vicinity of the intersections; executing process simulations of the lithography process by use of the mask pattern to which the correction patterns are applied; evaluating operation characteristics of circuit devices, which are obtained by the process simulations; reviewing the correction rules until desired operation characteristics are obtained and repeatedly executing the application of the correction patterns and the process simulations; and forming the circuit pattern on the substrate, by use of the mask pattern to which the correction patterns are applied, after obtaining the desired operation characteristics.

BRIEF DESCRIPTION OF THE DRAWINGS

FIG. 6 is a table of correction rules, which shows an example of the correction rules prepared by a correction rule preparation sub-unit shown in FIG. 4.

DETAILED DESCRIPTION OF EMBODIMENTS

Figure 1A:
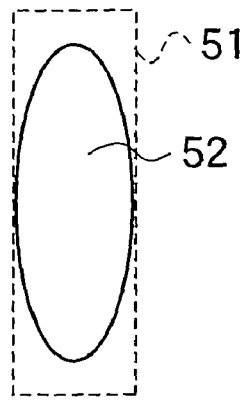
FIG. 1A is a plan view showing a pattern before being corrected by optical proximity correction according to the related art.
Figure 1B:
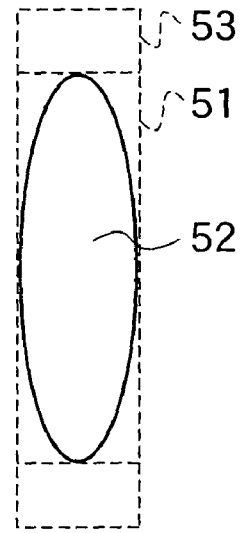
FIG. 1B is a plan view showing a correction pattern applied to the pattern before correction shown in FIG. 1A, the correction pattern being obtained by extending the pattern before correction in its longitudinal direction.
Figure 1C:
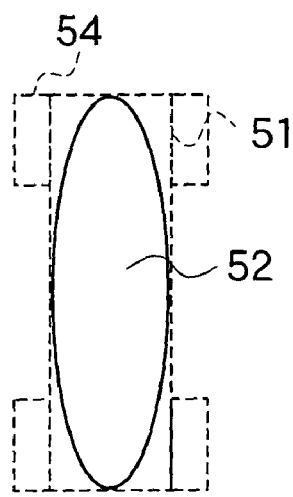
FIG. 1C is a plan view showing a hammer head applied to an end of the pattern before correction shown in FIG. 1A.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(First Embodiment)

<Pattern Designing System>

Figure 4:
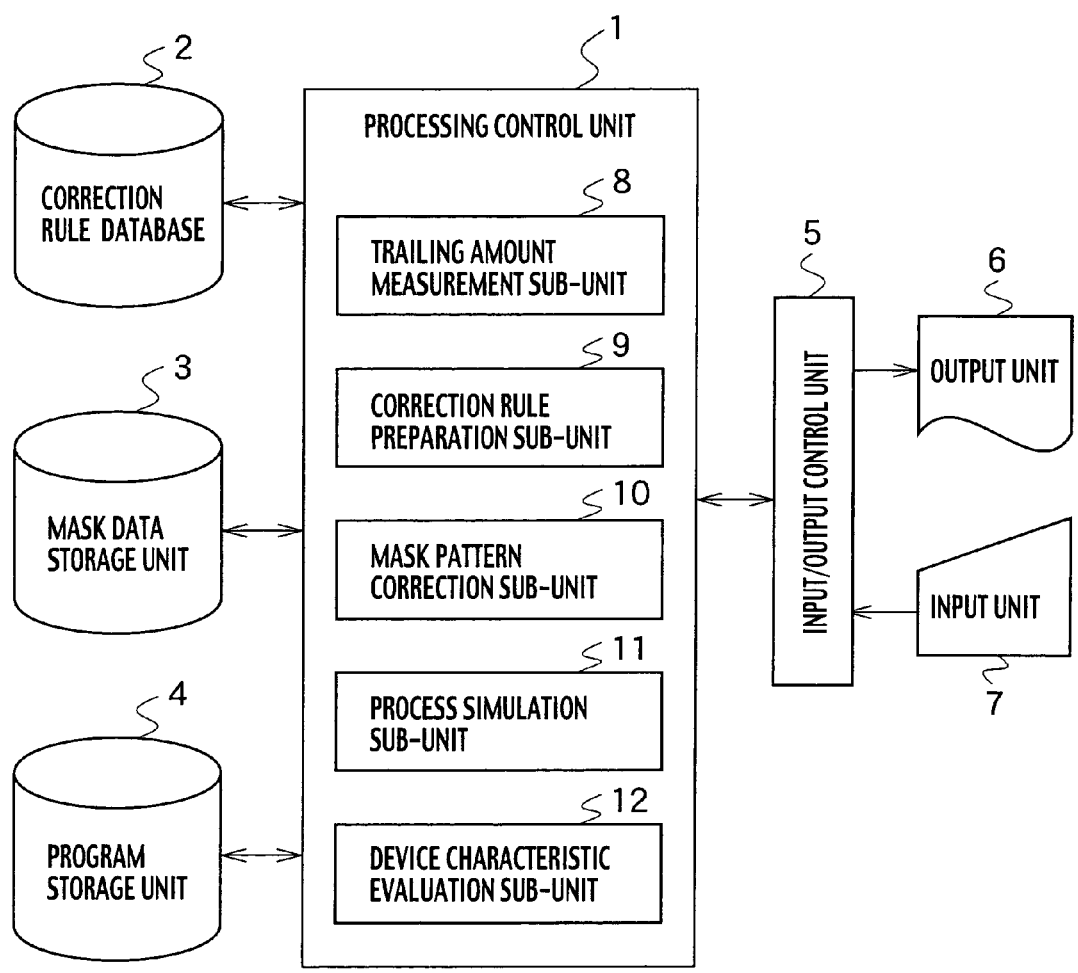
FIG. 4 is a block diagram showing a pattern designing system executing a pattern designing method according to a first embodiment of the present invention.

As shown in FIG. 4, a pattern designing system for executing a pattern designing method according to a first embodiment has: a processing control unit 1 including functions configured to design and correct a pattern; a correction rule database 2; a mask data storage unit 3; and a program storage unit 4. The correction rule database 2, mask data storage unit 3 and program storage unit 4 are connected to the processing control unit 1, respectively.

The processing control unit 1 has a footing amount measurement sub-unit 8, a correction rule preparation sub-unit 9, a mask pattern correction sub-unit 10, a process simulation sub-unit 11 and a device characteristic evaluation sub-unit 12. The correction rule database 2 stores correction rules considering a shape of a step pattern on a substrate to be processed. The mask data storage unit 3 stores CAD data of a mask pattern.

The footing amount measurement sub-unit 8 measures a level of footing of a circuit pattern, which occurs at an intersection of the circuit pattern and the step pattern designed on the substrate or at the intersection and in the vicinity thereof. The footing amount measurement sub-unit 8 measures the level of footing by carrying out experiments or lithography simulations.

The correction rule preparation sub-unit 9 prepares the correction rules. The correction rules are used for suppressing occurrence of the footing of the circuit pattern and designing the circuit pattern in accordance with a designed pattern. In other words, the correction rules are used for correcting dimensional changes of the circuit pattern in the vicinity of the step pattern. Specifically, the correction rule preparation sub-unit 9 prepares a table of the correction rules, which will be described later, as to a shape of a correction pattern by carrying out experiments or lithography simulations.

The mask pattern correction sub-unit 10 prepares the correction pattern in accordance with the correction rules and applies the correction pattern to the mask pattern.

The process simulation sub-unit 11 performs a simulation of a lithography process using the mask pattern to which the correction pattern is applied and a simulation of processing of the substrate using the circuit pattern transferred onto the substrate. The processing of the substrate includes processing of injecting impurities into the substrate.

By use of device simulations and the like, the device characteristic evaluation sub-unit 12 evaluates operation characteristics of circuit devices, which are calculated by the process simulation sub-unit 11.

Here, the "circuit pattern" includes a resist pattern transferred onto the substrate by the lithography process and a circuit device pattern designed on the substrate by means of the resist pattern. The "circuit device pattern" includes all patterns constituting the circuit devices such as a device isolation region, a well region, source/drain regions, a gate electrode, a contact hole and wiring.

The processing control unit 1 may be constituted as a part of a central processing unit (CPU) of a regular computer system. The footing amount measurement sub-unit 8, the correction rule preparation sub-unit 9, the mask pattern correction sub-unit 10, the process simulation sub-unit 11 and the device characteristic evaluation sub-unit 12 may be constituted by use of respective hardware dedicated thereto. Alternatively, functions substantially equivalent thereto may be realized by software.

The correction rule database 2, the mask data storage unit 3 and the program storage unit 4 may be constituted, respectively, by use of external storage units such as a semiconductor memory unit including a semiconductor ROM, a semiconductor RAM and the like, a magnetic disk, unit, a magnetic drum unit and a magnetic tape unit. Alternatively, those storage units may be also constituted by use of main storage units inside the CPU.

Moreover, to the processing control unit 1, an input unit 7 which receives inputs such as data and commands from an operator and an output unit 6 which outputs data of a prepared mask pattern are connected via an input/output control unit 5. The input unit 7 includes a keyboard, a mouse, a light pen, a flexible disk drive and the like. The output unit 6 includes a printer, a display unit or the like. The display unit includes a display unit such as a CRT display and a liquid crystal display.

The program storage unit 4 stores program instructions of respective processings executed by the processing control unit 1. The program instructions are read by the CPU according to need and the processing control unit 1 inside the CPU executes arithmetic processing thereof. Moreover, at the same time, data such as numeric information obtained at respective stages of a series of the arithmetic processing are stored in the mask data storage unit 3 such as a RAM and a magnetic disk.

Figure 2A:
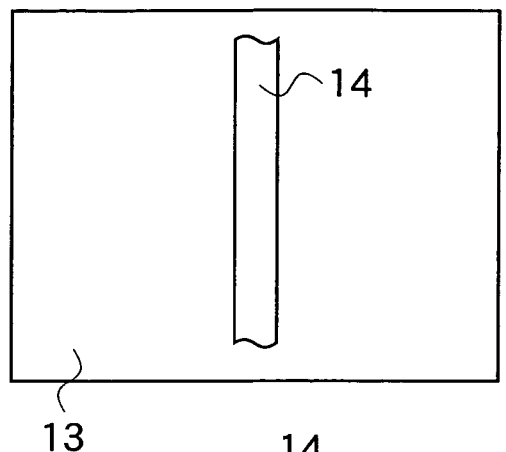
FIG. 2A is a plan view showing a step pattern formed on a substrate to be processed, as an example of an uneven base.
Figure 2B:
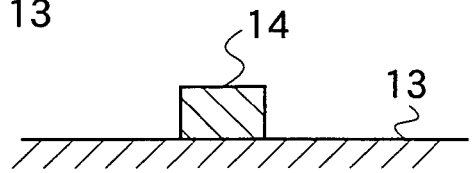
FIG. 2B is a cross-sectional view showing a shape of a cross section of the step pattern of FIG. 2A.
Figure 5:
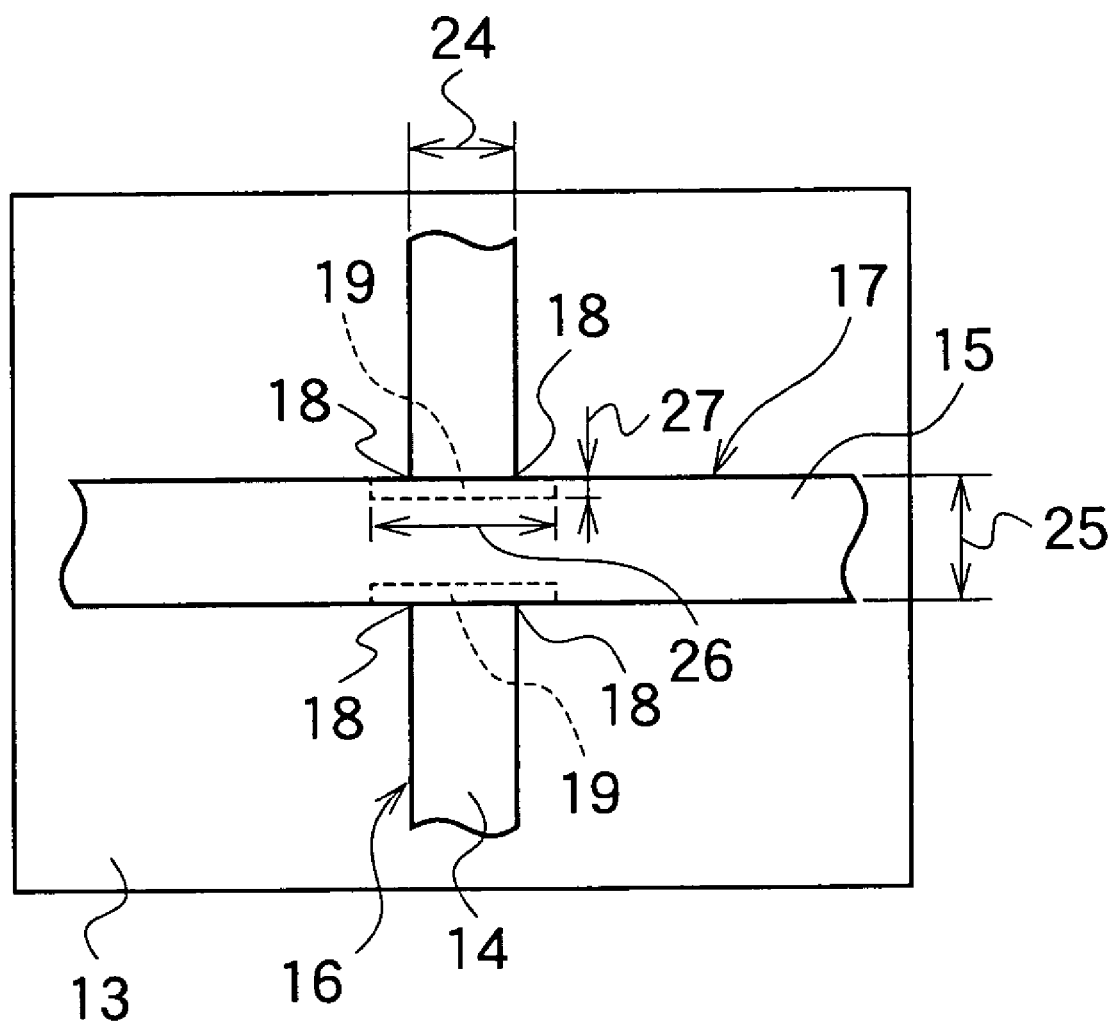
FIG. 5 is a plan view showing a step pattern designed on a substrate to be processed and a mask pattern which intersects with the step pattern.

As shown in FIG. 5, a step pattern 14 is designed on a substrate 13 to be processed. For example, the substrate 13 includes a silicon wafer and a silicon oxide film (an $SiO_2$ film) which is formed on the silicon wafer and has a thickness of 300 nm. Moreover, the step pattern 14 is made of polycrystalline silicon with a line width of 70 nm and a height of 175 nm. Note that the substrate 13 and the step pattern 14 which are shown in FIG. 5 are the same as the substrate 13 and the step pattern 14 shown in FIGS. 2A and 2B, respectively. On the substrate 13 having the step pattern 14 designed thereon, a circuit pattern is designed by use of a mask pattern 15 intersecting with the step pattern 14. For example, the circuit pattern is a positive resist pattern transferred onto the substrate 13 by performing the lithography process using the mask pattern 15. Moreover, a line width 25 of the mask pattern 15 is 250 nm. Around intersections 18 of edges 17 of the mask pattern 15 and edges 16 of the step pattern 14, correction patterns 19 are applied. The correction patterns 19 are applied on the inside of the edges 17 of the mask pattern 15 along the edges 17. Therefore, an actual mask pattern after correction, to which the correction patterns 19 are applied, corresponds to a part obtained by removing the correction patterns 19 from the mask pattern 15 before correction.

In consideration for at least one of a shape of the step pattern 14 and a shape of the circuit pattern, correction rules are prepared by use of experiments and lithography simulations. The shape of the step pattern 14 includes at least any one of a height thereof, a line width 24 thereof, a two-dimensional shape thereof and a distance between the step pattern 14 and a step pattern adjacent thereto. The shape of the circuit pattern includes at least any one of a line width thereof, a two-dimensional shape thereof and a distance between the circuit pattern and a circuit pattern adjacent thereto.

A table of the correction rules, which is shown in FIG. 6, shows correction rules as to width (W) and length (L) of a correction pattern and is prepared in consideration for the height and width of the step pattern out of the shape of the step pattern. For example, when the width of the step pattern is 400 nm and the height thereof is 200 nm, a correction pattern having the width (W) of 50 nm and the length (L) of 450 nm may be applied to the mask pattern. Note that FIG. 6 only shows an example of the table of the correction rules. The correction rule preparation sub-unit 9 may prepare a table similar to FIG. 6 as to other parameters related to the shape of the correction pattern besides the width (W) and length (L) thereof. The table of FIG. 6 is prepared in consideration for the height and width of the step pattern. However, the table may be prepared in consideration for the two-dimensional shape of the step pattern or the distance between the step pattern and its adjacent step pattern. Furthermore, the table of the correction rules may be prepared in consideration for the shape of the circuit pattern instead of or together with the shape of the step pattern.

<Pattern Designing Method>

Next, the pattern designing method according to the first embodiment will be described with reference to FIG. 7.

(a) First, in Step S01, the mask pattern 15 used in the lithography process for transferring the circuit pattern, which intersects with the step pattern 14, on the substrate 13 shown in FIG. 5 is prepared. The mask pattern 15 prepared in Step S01 is a mask pattern before correction, which is prepared based on design data and is not subjected to correction considering the step pattern 14.

(b) In Step S02, the footing amount measurement sub-unit 8 shown in FIG. 4 measures an amount of footing of edges of the circuit pattern, which occurs in executing the lithography process by use of the mask pattern 15 before correction. For example, the footing amount measurement sub-unit 8 measures a footing amount of the circuit pattern 55 shown in FIG. 3. Note that, in an exposure apparatus used herein, it is assumed that a light source wavelength is 248 nm, a numerical aperture (NA) of a projection lens is 0.60 and a coherence factor is 0.75.

(c) Next, in Step S03, the correction rule preparation sub-unit 9 prepares correction rules considering the shape of the step pattern 14 and the like. Specifically, a table of the correction rules as shown in FIG. 6 is prepared. The prepared correction rules are stored in the correction rule database 2.

(d) Next, in Step S04, the mask pattern correction sub-unit 10 applies the correction patterns 19 to the mask pattern 15 before correction as shown in FIG. 5 in accordance with the prepared correction rules. Specifically, the correction patterns 19 are applied to the intersections 18 of the edges 17 of the mask pattern 15 and the edges 16 of the step pattern 14 and in the vicinity of the intersections 18. Data of the mask pattern 15 having the correction patterns 19 applied thereto are stored in the mask data storage unit 3.

(e) Next, in Step S05, the process simulation sub-unit 11 executes process simulations by use of the mask pattern 15 having the correction patterns 19 applied thereto. For example, the process simulation sub-unit 11 calculates a resist pattern to be transferred onto the substrate 13, by executing a simulation of the lithography process using the mask pattern 15 having the correction patterns 19 applied thereto. Thereafter, the process simulation sub-unit 11 executes a simulation of an impurity implantation process using the calculated resist pattern. Specifically, the process simulations in Step S05 include simulations of processing of the substrate, such as the simulation of the lithography process, the simulation of the impurity implantation process and a simulation of an anisotropic etching process.

(f) Next, in Step S06, by use of device simulations and the like, the device characteristic evaluation sub-unit 12 evaluates operation characteristics of circuit devices, which are obtained by the process simulations. As a result of the evaluation, when the operation characteristics of the circuit devices do not satisfy predetermined reference values (No in Step S06), the processing advances to Step S07. In Step S07, the correction rules are reviewed so that the operation characteristics of the circuit devices satisfy the predetermined reference values and Steps S04 to S06 are executed again. To be more specific, until desired operation characteristics are obtained, by reviewing the correction rules (Step S07), the application of the correction patterns (Step S04), the execution of the process simulations (Step S05) and the evaluation of the operation characteristics (Step S06) are repeatedly performed. Thereafter, as a result of evaluating the operation characteristics of the circuit devices, when the operation characteristics of the circuit devices satisfy the predetermined reference values (Yes in Step S06), all the procedures of the pattern designing method according to the first embodiment are finished.

Figure 8:
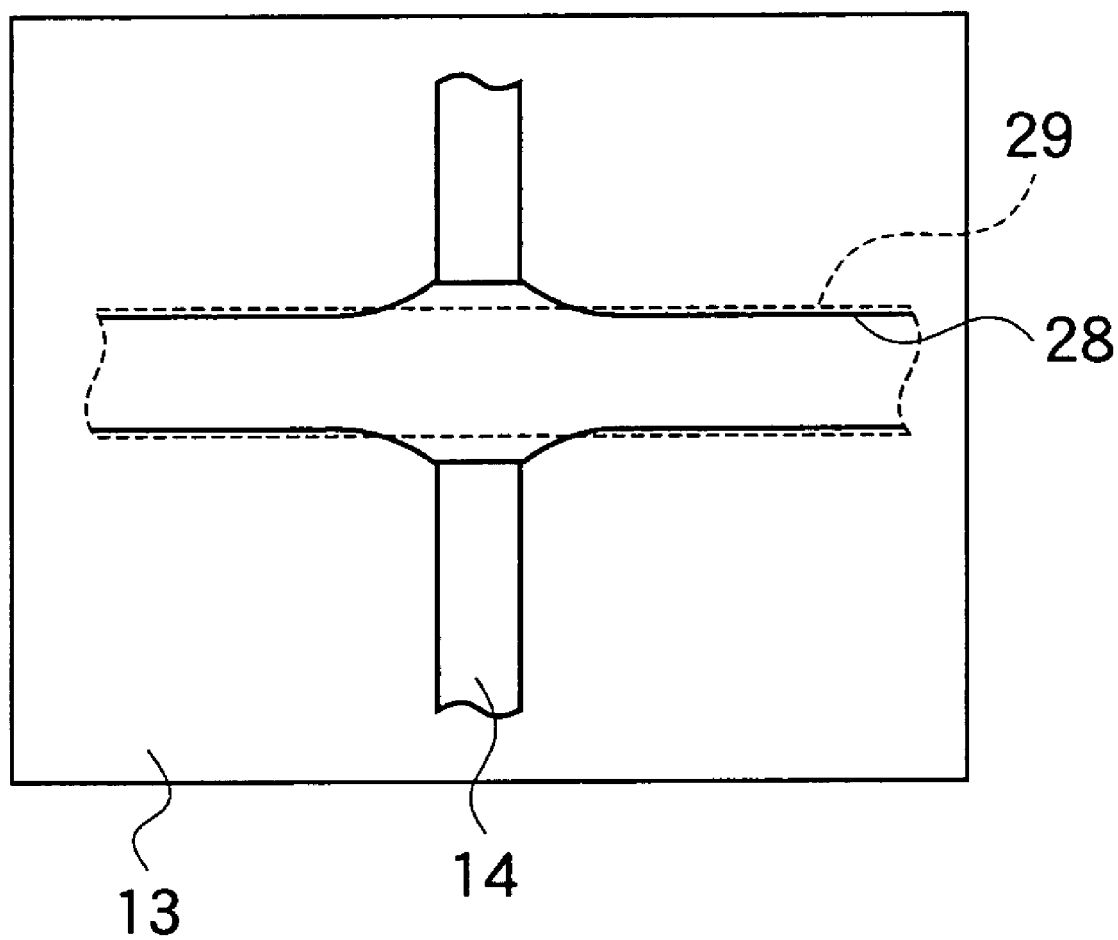
FIG. 8 is a plan view showing a relationship between a circuit pattern and a designed pattern, the circuit pattern being transferred using a mask pattern designed by the pattern designing method according to the first embodiment and first to fourth modifications.

By use of the pattern designing method according to the first embodiment, in the case of designing the circuit pattern on the substrate 13 having the step pattern 14 designed thereon, the correction patterns 19 shown in FIG. 5 are applied to the mask pattern 15. Thus, the footing of the circuit pattern 55 shown in FIG. 3 can be suppressed and a circuit pattern 28 approximate to a designed pattern 29 can be designed as shown in FIG. 8.

The method for designing patterns mentioned above is expressed in time-series processes, operations, or procedures that are executable in a computer system. Therefore, the method for designing patterns can be controlled by a computer program that specifies functions achieved by, for example, a processor in a computer system. The computer program may be stored in a computer program product. The computer program is read from the computer program product by a computer system and is executed thereby, to control the computer system and carry out the method for designing patterns. The computer program product may be used as the program storage unit 4 shown in FIG. 4. Alternatively, the computer program may be read and stored in the program storage unit 4 to control processes carried out by the processing control unit 1. The computer program product may be implemented by a memory unit, a magnetic disk drive, an optical disk drive, or any other device capable of storing the computer program.

Figure 9:
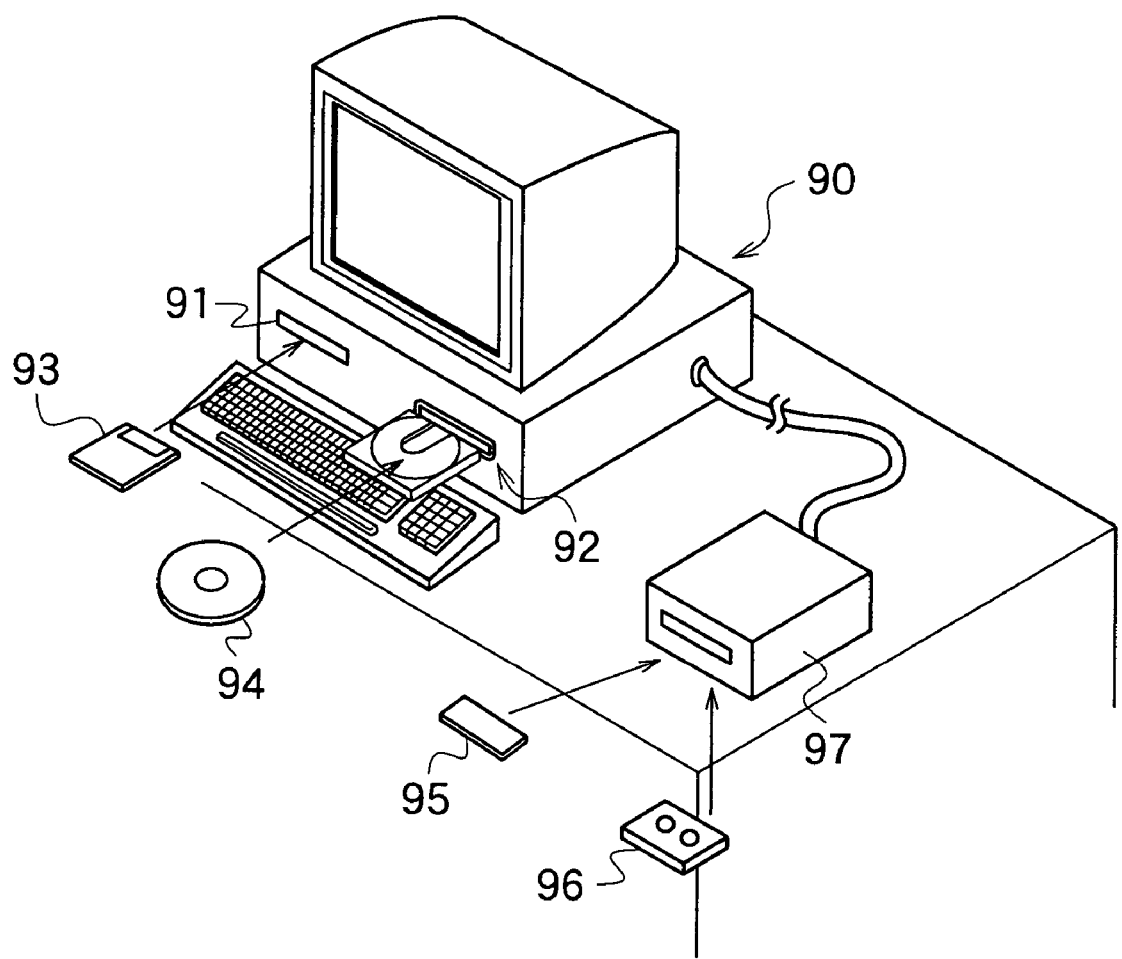
FIG. 9 is an external view showing an example of the pattern designing system according to the first embodiment, which consists of a computer system to realize the pattern designing method by reading a computer program product and controlling a plurality of functions carried out by the pattern designing system in accordance with procedures described in the product.

FIG. 9 shows an example of a computer system 90 serving as the system for designing patterns according to the first embodiment of the present invention. A front area of the computer system 90 includes a flexible disk drive 91 and a CD-ROM drive 92. The flexible disk drive 91 receives a magnetic flexible disk 93 and reads programs therefrom. The CD-ROM drive 92 receives a CD-ROM 94 and reads programs therefrom. In this way, programs stored in computer program products are installed in the system 90. A drive 97 is connectable to the computer system 90, to handle a ROM 95 that is a semiconductor memory used for, for example, a game pack, or a magnetic cassette tape 96.

(First Modification)

The shape and application of the correction patterns 19 shown in FIG. 5 are only described as one embodiment of the present invention. The present invention is not limited thereto. In first to fourth modifications of the first embodiment, description will be given of correction patterns having shapes and applications which are different from those of the correction patterns 19 shown in FIG. 5.

Figure 10:
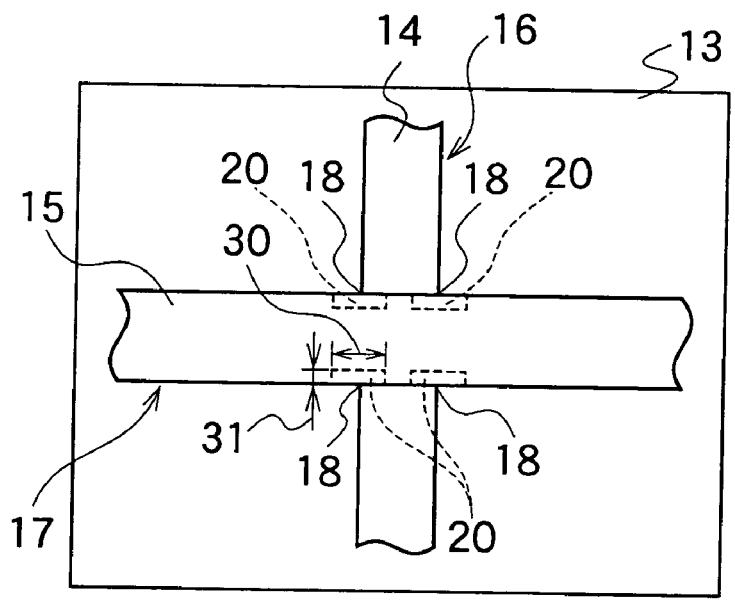
FIG. 10 is a plan view showing a correction pattern according to the first modification of the first embodiment.

As shown in FIG. 10, on a substrate 13 to be processed, which has a step pattern 14 designed thereon, a circuit pattern is designed by use of a mask pattern 15 intersecting with the step pattern 14. The substrate 13, the step pattern 14 and the mask pattern 15 which are shown in FIG. 10 are the same as those of FIG. 5.

The correction patterns 20 are applied at intersections 18 of edges 17 of the mask pattern 15 and edges 16 of the step pattern 14 and in the vicinity of the intersections 18. The correction patterns 20 are applied on the inside of the edges 17 of the mask pattern 15 along the edges 17. Moreover, at the intersections 18 and in the vicinity thereof, four of the correction patterns 20 are applied separately from each other. An actual mask pattern after correction, to which the correction patterns 20 are applied, corresponds to a part obtained by removing the correction patterns 20 from the mask pattern 15 before correction.

Figure 3:
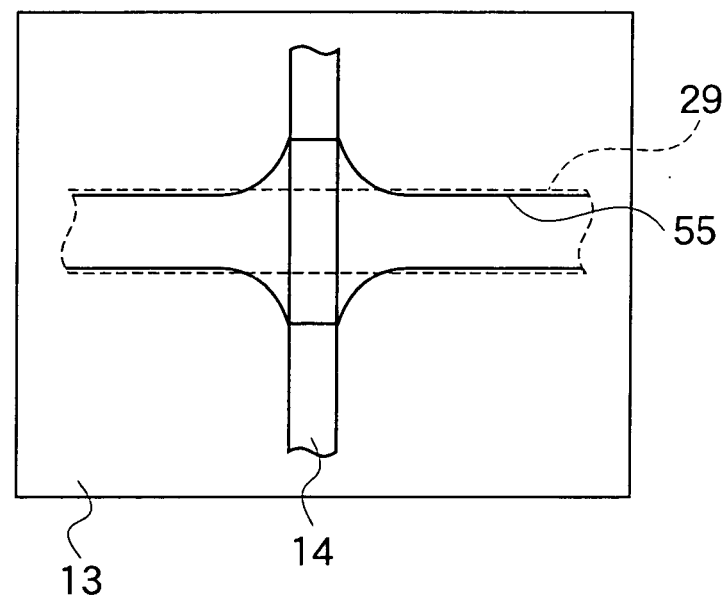
FIG. 3 is a plan view showing a mask pattern, which intersects with the step pattern shown in FIGS. 2A and 2B, and a circuit pattern transferred using the mask pattern.

By applying the correction patterns 20, the footing of the circuit pattern 55 shown in FIG. 3 can be suppressed and the circuit pattern 28 approximate to the designed pattern 29 can be designed as shown in FIG. 8. Note that, in the first modification, the correction rule preparation sub-unit 9 prepares a table of correction rules for a length 30 and width 31 of the correction pattern 20.

(Second Modification)

Figure 11:
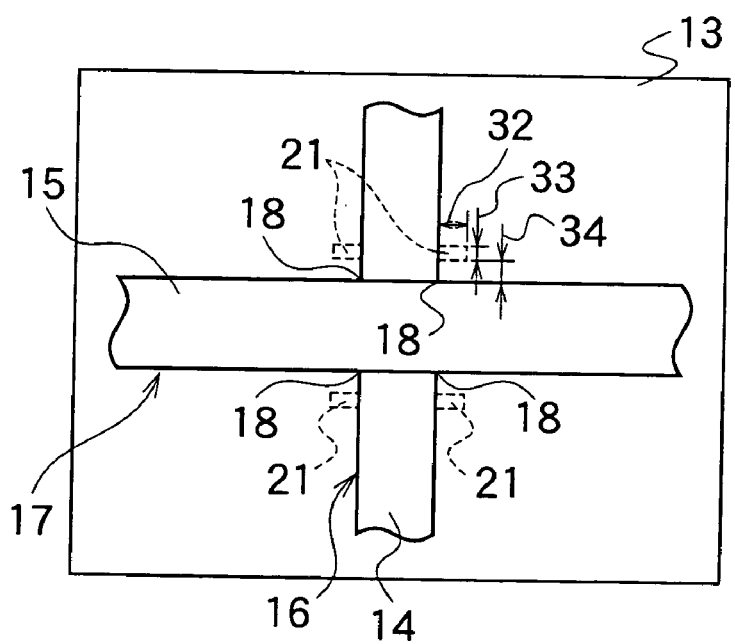
FIG. 11 is a plan view showing a correction pattern according to the second modification of the first embodiment.

As shown in FIG. 11, on a substrate 13, which has a step pattern 14 designed thereon, a circuit pattern is designed by use of a mask pattern 15 intersecting with the step pattern 14. The substrate 13, the step pattern 14 and the mask pattern 15 which are shown in FIG. 11 are the same as those of FIG. 5.

In the vicinity of intersections 18 of edges 17 of the mask pattern 15 and edges 16 of the step pattern 14, correction patterns 21 are applied. The correction patterns 21 are applied on the outside of the edges 17 of the mask pattern 15 at a fixed distance 34 from the edges 17. Moreover, around the intersections 18, four of the correction patterns 21 are applied separately from each other. Furthermore, a width 33 of the correction patterns 21 is below resolution limit of an exposure apparatus and the correction patterns 21 are minute patterns which are never actually transferred onto the substrate 13. An actual mask pattern after correction, to which the correction patterns 21 are applied, corresponds to one obtained by applying the correction patterns 21 to the mask pattern 15 before correction.

By applying the correction patterns 21, the footing of the circuit pattern 55 shown in FIG. 3 can be suppressed and the circuit pattern 28 approximate to the designed pattern 29 can be designed as shown in FIG. 8. Note that, in the second modification, the correction rule preparation sub-unit 9 prepares a table of correction rules for each of a length 32 and width 33 of the correction pattern 21 and a fixed distance 34 from the edges 17 of the mask pattern 15.

(Third Modification)

Figure 12:
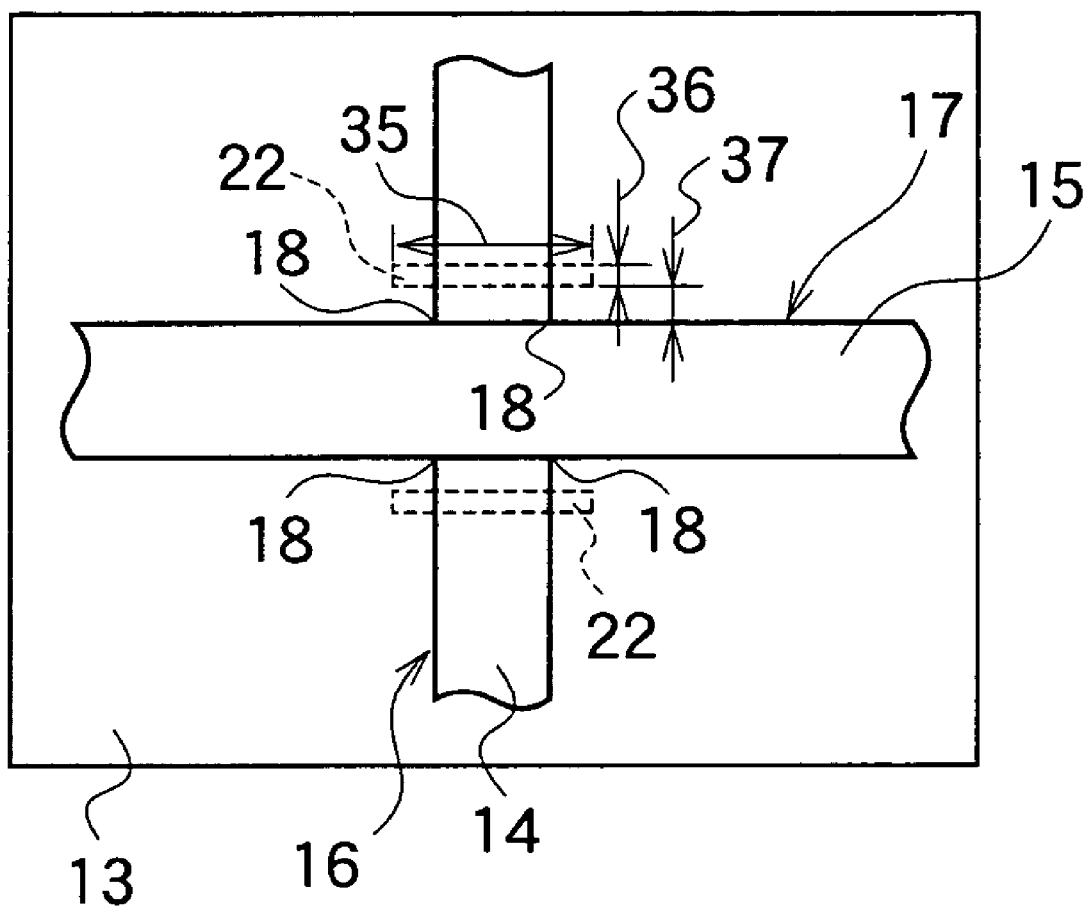
FIG. 12 is a plan view showing a correction pattern according to the third modification of the first embodiment.

As shown in FIG. 12, on a substrate 13, which has a step pattern 14 designed thereon, a circuit pattern is designed by use of a mask pattern 15 intersecting with the step pattern 14. The substrate 13, the step pattern 14 and the mask pattern 15 which are shown in FIG. 12 are the same as those of FIG. 5.

Around intersections 18 of edges 17 of the mask pattern 15 and edges 16 of the step pattern 14, correction patterns 22 are applied. The correction patterns 22 are applied on the outside of the edges 17 of the mask pattern 15 at a fixed distance 37 from the edges 17. Furthermore, a width 36 of the correction patterns 22 is below resolution limit of an exposure apparatus and the correction patterns 22 are minute patterns which are never actually transferred onto the substrate 13 to be processed. An actual mask pattern after correction, to which the correction patterns 22 are applied, corresponds to one obtained by applying the correction patterns 22 to the mask pattern 15 before correction.

By applying the correction patterns 22, the footing of the circuit pattern 55 shown in FIG. 3 can be suppressed and the circuit pattern 28 approximate to the designed pattern 29 can be designed as shown in FIG. 8. Note that, in the third modification, the correction rule preparation sub-unit 9 prepares a table of correction rules for each of a length 35 and width 36 of the correction pattern 22 and a fixed distance 37 from the edges 17 of the mask pattern 15.

(Fourth Modification)

Figures 13A, 13B:
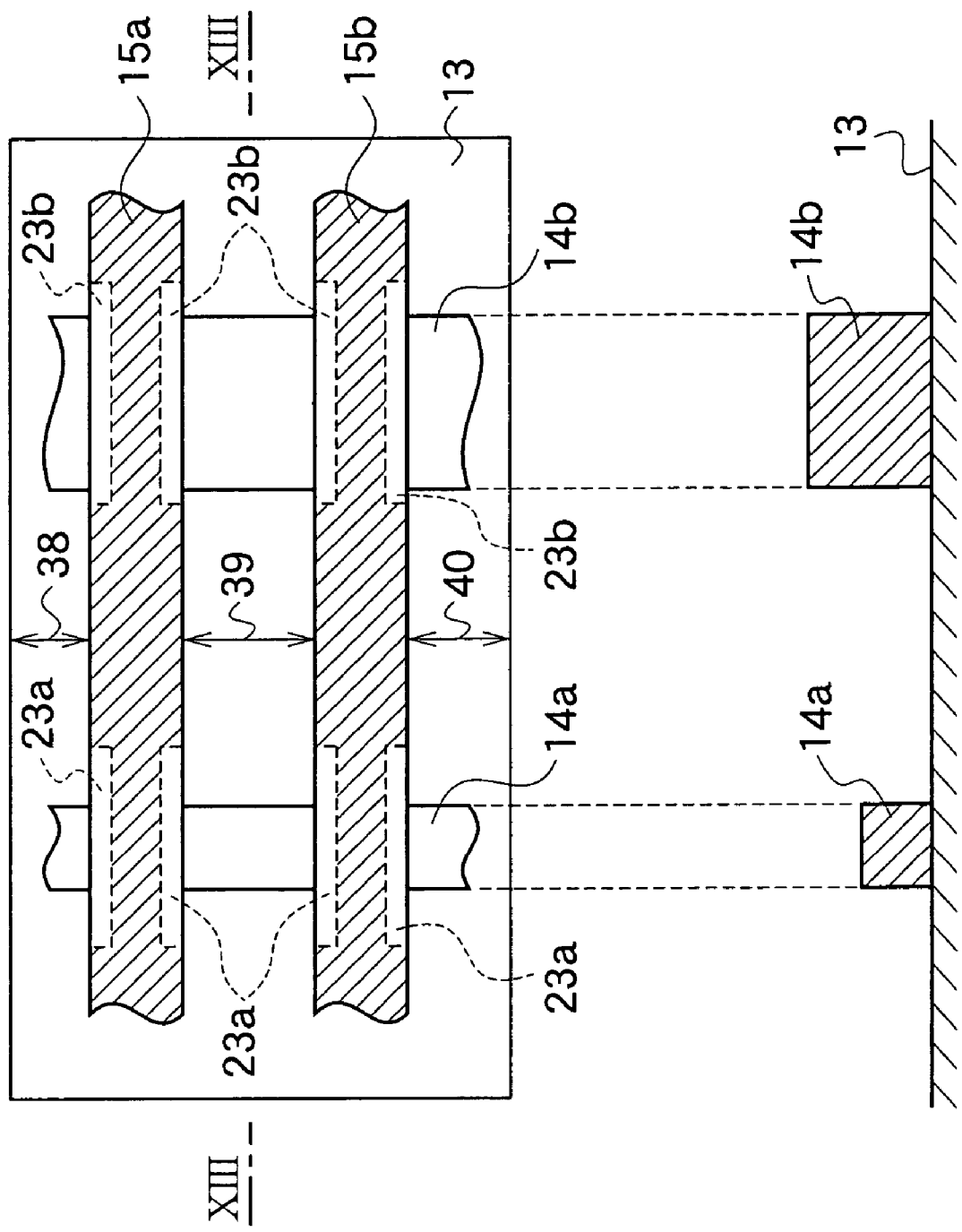
FIG. 13A is a plan view showing a correction pattern according to the fourth modification of the first embodiment.
FIG. 13B is a cross-sectional view along the section XIII—XIII, showing a shape of a cross section of a step pattern in FIG. 13A.

As shown in FIGS. 13A and 13B, first and second step patterns 14a and 14b which have different line widths and heights from each other are designed on a substrate 13. The first step pattern 14a is made of polycrystalline silicon having a line width of 70 nm and a height of 175 nm. The second step pattern 14b is made of polycrystalline silicon having a line width of 120 nm and a height of 250 nm. By using first and second mask patterns 15a and 15b which intersect with the first and second step patterns 14a and 14b, a resist pattern is designed. Both of the first and second mask patterns 15a and 15b have a line width of 250 nm. Moreover, a distance between the first and second mask patterns 15a and 15b is defined as each of first to third inter-pattern distances 38 to 40.

At intersections of edges of the first and second mask patterns 15a and 15b and edges of the first step pattern 14a and in the vicinity of the intersections, first correction patterns 23a are applied, respectively. At intersections of edges of the first and second mask patterns 15a and 15b and edges of the second step pattern 14b and in the vicinity of the intersections, second correction patterns 23b are applied, respectively. The first and second correction patterns 23a and 23b are applied on the inside of the edges 17 of the first and second mask patterns 15a and 15b along the edges 17. Actual mask patterns after correction, to which the first and second correction patterns 23a and 23b are applied, correspond to parts obtained by removing the first and second correction patterns 23a and 23b from the first and second mask patterns 15a and 15b before correction. The width of the first and second correction patterns 23a and 23b are below resolution limit of an exposure apparatus and the first and second correction patterns 23a and 23b are minute patterns which are never actually transferred onto the substrate 13.

By applying the first and second correction patterns 23a and 23b, the footing of the circuit pattern can be suppressed and the circuit pattern approximate to the designed pattern can be designed. Note that, in the fourth modification, the correction rule preparation sub-unit 9 prepares a table of correction rules in consideration for the first to third inter-pattern distances 38 to 40. The first and second correction patterns 23a and 23b are prepared in consideration for the first to third inter-pattern distances 38 to 40 besides the shapes of the first and second step patterns 14a and 14b and the shape of the first and second mask patterns 15a and 15b.

As described above, according to the fourth modification, even when there are a plurality of step patterns or mask patterns which have different shapes from each other, correction patterns suitable for respective shapes of the step patterns or the mask patterns can be prepared.

(Second Embodiment)

Figure 14:
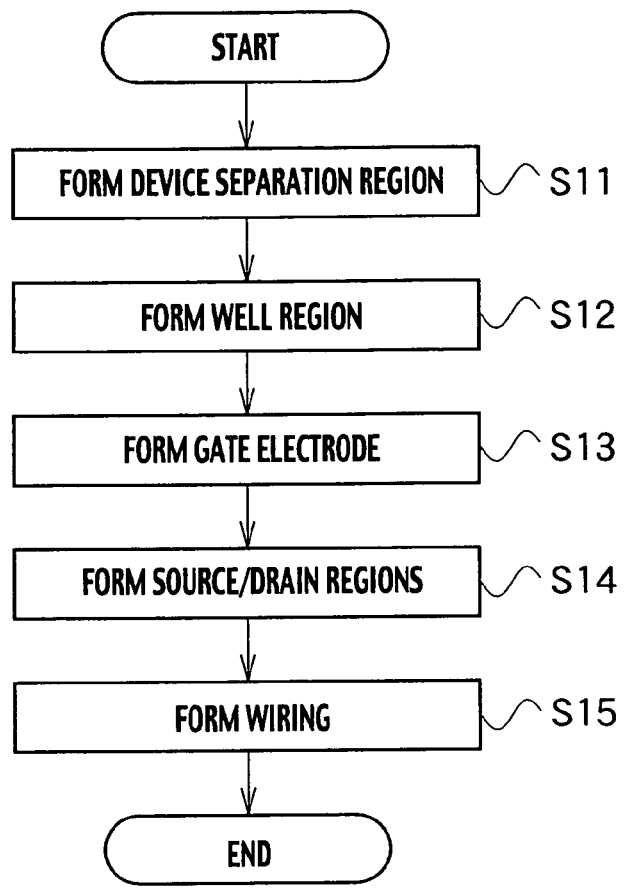
FIG. 14 is a flowchart showing a method of manufacturing a semiconductor device according to a second embodiment of the present invention.

As shown in FIG. 14, a method of manufacturing a semiconductor device according to a second embodiment includes Steps S11 to S15.

(a) First, in Step S11, an element isolation region is formed. Specifically, a heat-resistant thermal oxide film such as a silicon nitride film (an $Si_3N_4$ film) is formed on a substrate, a resist pattern having an aperture in the element isolation region is designed by a lithography process and the silicon nitride film exposed to the aperture of the resist pattern is selectively removed. Thereafter, the substrate exposed to the aperture of the silicon nitride film is selectively subjected to thermal oxidation.

(b) Next, in Step S12, a well region is formed in a region where a MOS transistor is formed. Specifically, a resist pattern having an aperture in the region where the MOS transistor is formed is formed by the lithography process and impurities are selectively implanted by using this resist pattern.

(c) Next, in Step S13, a gate electrode is formed on the substrate. Specifically, a polycrystalline silicon film is formed on the substrate, a resist pattern is formed in a portion of the gate electrode by the lithography process and the polycrystalline silicon film is selectively removed by using the resist pattern.

(d) Next, in Step S14, source/drain regions are formed by implanting impurities into the substrate. Specifically, a resist pattern having apertures in regions where the source/drain regions are formed is formed by the lithography process and impurities are selectively implanted by using this resist pattern. Through the above-described Steps S11 to S15, the MOS transistor is formed on the substrate.

(e) Lastly, in Step S15, wiring which connects between a plurality of MOS transistors is formed on the substrate. Specifically, an interlayer insulating film is deposited on the substrate, a resist pattern having an aperture in a region where a contact and the wiring are formed is formed by the lithography process and the interlayer insulating film is selectively etched by using this resist pattern. In the formed contact hole and wiring groove, a wiring material such as copper is buried. Through the above-described processes, procedures of the method of manufacturing a semiconductor device according to the second embodiment are finished.

Figure 15:
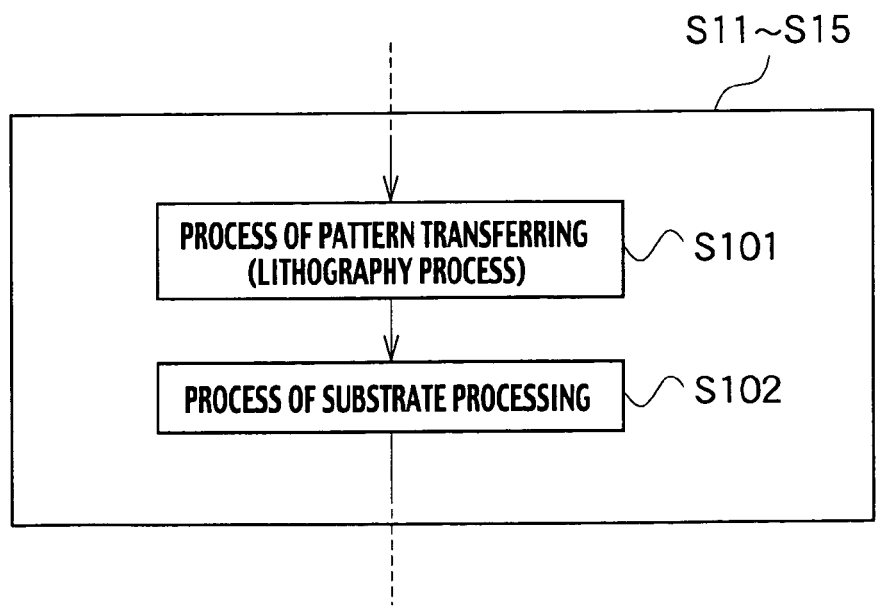
FIG. 15 is a flowchart showing procedures included in each of the steps S11 to S15 shown in FIG. 14.

Each of Steps S11 to S15 shown in FIG. 14 has Steps S101 and S102 shown in FIG. 15. Specifically, first, in the lithography process, a mask pattern having a predetermined shape is transferred onto the substrate and thus a resist pattern is designed (S101). Thereafter, by use of this resist pattern, processing of the substrate is performed (S102). In the second embodiment of the present invention, the mask pattern used in the lithography process of Step S101 is designed and corrected by use of the pattern designing method shown in FIG. 7.

Figure 7:
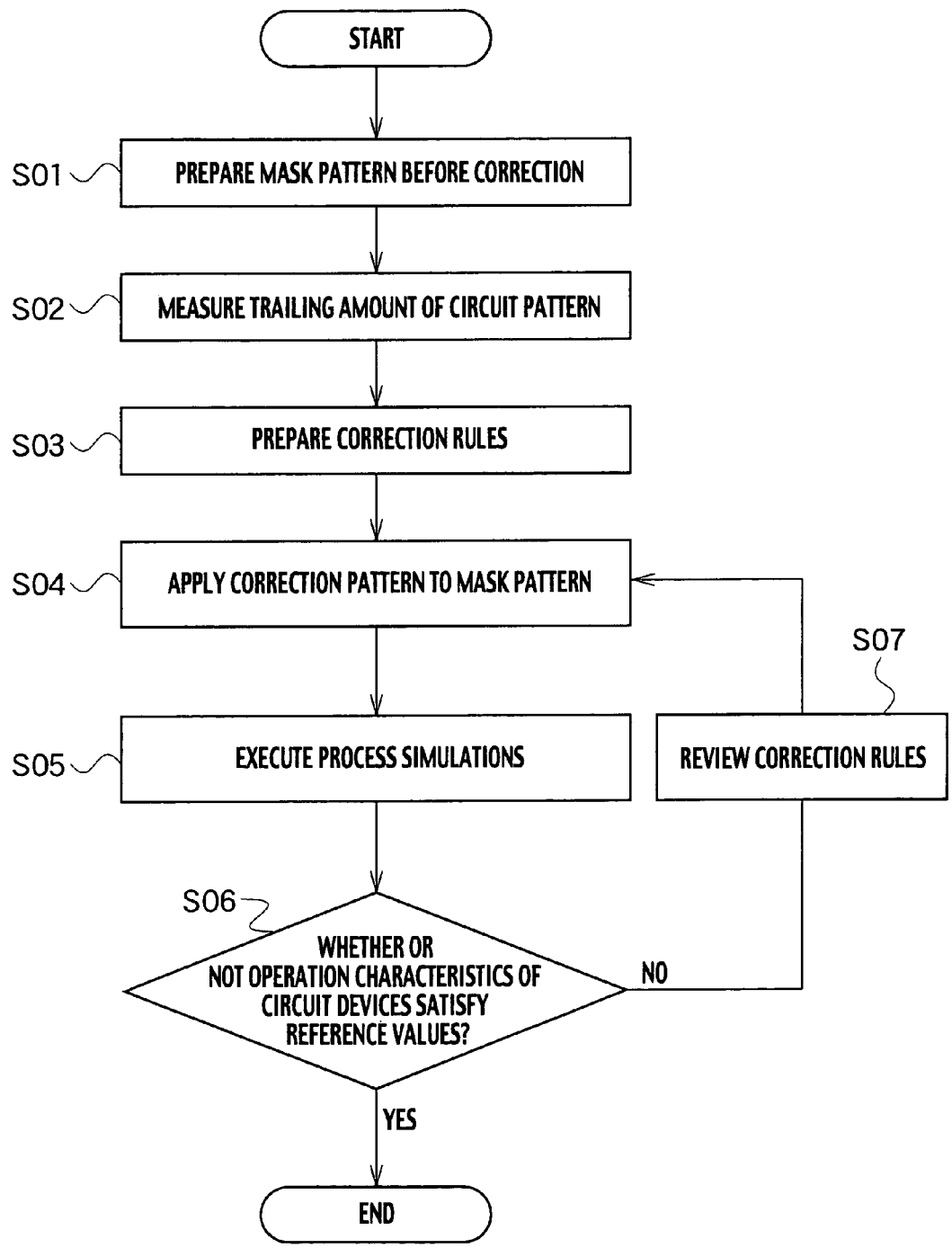
FIG. 7 is a flowchart showing the pattern designing method according to the first embodiment of the present invention.

Note that the step to use the pattern designing method shown in FIG. 7 may be at least any one of Steps S11 to S15. Needless to say, in all the steps (S11 to S15), the pattern designing method shown in FIG. 7 may be used. Particularly, it is preferable to use the pattern designing method shown in FIG. 7 for the mask pattern used in implanting impurities into the substrate such as the well region and the source/drain regions. Furthermore, in the case of forming the source/drain regions (S14) after forming the gate electrode (S13), there is a risk that the gate electrode becomes a step pattern and thus the source/drain regions are not transferred in accordance with a designed pattern. Therefore, it is preferable to use the pattern designing method shown in FIG. 7 for a mask pattern for forming the source/drain regions. This is because, when footing occurs at intersections of the source/drain regions and the gate electrode, a channel length deviates from its designed value and thus operation characteristics may be affected thereby.

As described above, according to the first and second embodiments of the present invention, in the case of designing a pattern on a step, a pattern designing method, a pattern designing program and a method of manufacturing a semiconductor device, which are capable of designing a pattern approximate to a designed dimension can be provided.

As mentioned above, the present invention has been described through the first and second embodiments and modifications thereof, however, the descriptions and drawings that constitute a portion of this disclosure should not be perceived as those limiting the present invention. Various alternative embodiments and operational techniques will become clear to persons skilled in the art from this disclosure.

Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of designing patterns, comprising:
preparing a mask pattern used in a lithography process for transferring a circuit pattern intersecting with a step pattern on a substrate which has the step pattern designed thereon;
obtaining an amount of disparity between the circuit pattern and the mask pattern, the disparity occurring at one of intersections of edges of the circuit pattern and the step pattern or the intersections and in the vicinity thereof in executing the lithography process by use of the mask pattern; and
applying correction patterns to the mask pattern in accordance with correction rules considering a shape of the step pattern and the disparity, the correction patterns being applied at the intersections of edges of the circuit pattern and the step pattern and in the vicinity of the intersections.

2. The method of claim 1, further comprising preparing the correction rules by use of experiments or lithography simulations, in consideration for at least one of the shape of the step pattern and a shape of the circuit pattern.

3. The method of claim 2, wherein the shape of the step pattern includes at least any one of a height of the step pattern, a line width of the step pattern, a two-dimensional shape of the step pattern and a distance between the step pattern and a step pattern adjacent thereto, and the shape of the circuit pattern includes at least any one of a line width of the circuit pattern, a two-dimensional shape of the circuit pattern and a distance between the circuit pattern and a circuit pattern adjacent thereto.

4. The method of claim 1, wherein the circuit pattern defines impurity implantation regions.

5. A method of designing patterns, comprising:
preparing a mask pattern used in a lithography process for transferring a circuit pattern intersecting with a step pattern on a substrate which has the step pattern designed thereon;
obtaining an amount of footing of edges of the circuit pattern, the footing occurring at one of intersections of the edges of the circuit pattern and the step pattern or the intersections and in the vicinity thereof in executing the lithography process by use of the mask pattern;
preparing correction rules considering a shape of the step pattern;
applying correction patterns to the mask pattern in accordance with the correction rules, the correction patterns being applied at the intersections and in the vicinity of the intersections;
executing process simulations by use of the mask pattern to which the correction patterns are applied;
evaluating operation characteristics of circuit devices, which are obtained by the process simulations; and
reviewing the correction rules until desired operation characteristics are obtained and repeatedly executing the application of the correction patterns and the process simulations.

6. The method of claim 5, wherein the process simulations are impurity implantation simulations.

7. A computer program product for designing patterns, comprising:

instructions configured to prepare a mask pattern used in a lithography process for transferring a circuit pattern intersecting with a step pattern on a substrate which has the step pattern designed thereon;

instructions configured to obtain an amount of disparity between the circuit pattern and the mask pattern, the disparity occurring at one of intersections of edges of the circuit pattern and the step pattern or the intersections and in the vicinity thereof in executing the lithography process by use of the mask pattern; and instructions configured to apply correction patterns to the mask pattern in accordance with correction rules considering a shape of the step pattern and the disparity, the correction patterns being applied at the intersections of edges of the circuit pattern and the step pattern and in the vicinity of the intersections.

8. The computer program product of claim 7, further comprising instructions configured to prepare the correction rules by use of experiments or lithography simulations, in consideration for at least one of the shape of the step pattern and a shape of the circuit pattern.

9. The computer program product of claim 8, wherein the shape of the step pattern includes at least any one of a height of the step pattern, a line width of the step pattern, a two-dimensional shape of the step pattern and a distance between the step pattern and a step pattern adjacent thereto, and the shape of the circuit pattern includes at least any one of a line width of the circuit pattern, a two-dimensional shape of the circuit pattern and a distance between the circuit pattern and a circuit pattern adjacent thereto.

10. The computer program product of claim 7, wherein the circuit pattern defines impurity implantation regions.

11. A computer program product for designing patterns, comprising:

instructions configured to prepare a mask pattern used in a lithography process for transferring a circuit pattern intersecting with a step pattern on a substrate which has the step pattern designed thereon;

instructions configured to obtain an amount of footing of edges of the circuit pattern, the footing occurring at one of intersections of the edges of the circuit pattern and the step pattern or the intersections and in the vicinity thereof in executing the lithography process by use of the mask pattern;

instructions configured to prepare correction rules considering a shape of the step pattern;

instructions configured to apply correction patterns to the mask pattern in accordance with the correction rules, the correction patterns being applied at the intersections and in the vicinity of the intersections;

instructions configured to execute process simulations by use of the mask pattern to which the correction patterns are applied;

instructions configured to evaluate operation characteristics of circuit devices, which are obtained by the process simulations; and instructions configured to review the correction rules until desired operation characteristics are obtained and repeatedly executing the application of the correction patterns and the process simulations.

12. The computer program product of claim 11, wherein the process simulations are impurity implantation simulations.

13. A method of manufacturing a semiconductor device, comprising:

preparing a mask pattern used in a lithography process for designing a circuit pattern intersecting with a step pattern on a substrate which has the step pattern designed thereon;

obtaining an amount of disparity between the circuit pattern and the mask pattern, the disparity occurring at one of intersections of edges of the circuit pattern and the step pattern or the intersections and in the vicinity thereof in executing the lithography process by use of the mask pattern;

applying correction patterns to the mask pattern in accordance with correction rules considering a shape of the step pattern and the disparity, the correction patterns being applied at intersections of edges of the circuit pattern and the step pattern and in the vicinity of the intersections; and forming the circuit pattern on the substrate, by use of the mask pattern to which the correction patterns are applied.

14. The method of claim 13, further comprising preparing the correction rules by use of experiments or lithography simulations, in consideration for at least one of the shape of the step pattern and a shape of the circuit pattern.

15. The method of claim 14, wherein the shape of the step pattern includes at least any one of a height of the step pattern, a line width of the step pattern, a two-dimensional shape of the step pattern and a distance between the step pattern and a step pattern adjacent thereto, and the shape of the circuit pattern includes at least any one of a line width of the circuit pattern, a two-dimensional shape of the circuit pattern and a distance between the circuit pattern and a circuit pattern adjacent thereto.

16. The method of claim 13, wherein the circuit pattern defines impurity implantation regions.

17. A method of manufacturing a semiconductor device, comprising:

preparing a mask pattern used in a lithography process for transferring a circuit pattern intersecting with a step pattern on a substrate which has the step pattern designed thereon;

obtaining an amount of footing of edges of the circuit pattern, the footing occurring at one of intersections of the edges of the circuit pattern and the step pattern or the intersections and in the vicinity thereof in executing the lithography process by use of the mask pattern;

preparing correction rules considering a shape of the step pattern;

applying correction patterns to the mask pattern in accordance with the correction rules, the correction patterns being applied at the intersections and in the vicinity of the intersections;

executing process simulations of the lithography process by use of the mask pattern to which the correction patterns are applied;

evaluating operation characteristics of circuit devices, which are obtained by the process simulations;

reviewing the correction rules until desired operation characteristics are obtained and repeatedly executing the application of the correction patterns and the process simulations; and forming the circuit pattern on the substrate, by use of the mask pattern to which the correction patterns are applied, after obtaining the desired operation characteristics.

18. The method of claim 17, wherein the process simulations are impurity implantation simulations.

* * * * *